(12) United States Patent
Lee (10) Patent No.: US 8,196,069 B2
(45) Date of Patent: Jun. 5, 2012

(54) METHOD FOR FABRICATING ASSIST FEATURES IN A PHOTOMASK

(75) Inventor: Jeon Kyu Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 260 days.

(21) Appl. No.: 12/639,684

(22) Filed: Dec. 16, 2009

(65) Prior Publication Data

US 2011/0004854 A1 Jan. 6, 2011

(30) Foreign Application Priority Data

Jul. 1, 2009 (KR) .................. 10-2009-0059919

(51) Int. Cl.
*G06F 17/50* (2006.01)
(52) U.S. Cl. .............. 716/54; 716/50; 716/52; 430/5
(58) Field of Classification Search .......... 716/50, 716/52, 54; 430/5
See application file for complete search history.

(56) References Cited

U.S. PATENT DOCUMENTS

| | | | |
|---|---|---|---|
| 5,242,770 A | | 9/1993 | Chen et al. |
| 5,447,810 A * | | 9/1995 | Chen et al. .................. 430/5 |
| 5,821,014 A | | 10/1998 | Chen et al. |
| 6,413,683 B1 | | 7/2002 | Liebmann et al. |
| 6,421,820 B1 | | 7/2002 | Mansfield et al. |
| 6,684,382 B2 * | | 1/2004 | Liu ............................. 716/52 |
| 6,881,523 B2 * | | 4/2005 | Smith ......................... 430/5 |
| 6,883,159 B2 | | 4/2005 | Schenker et al. |
| 7,024,655 B2 * | | 4/2006 | Cobb .......................... 716/52 |
| 7,247,574 B2 * | | 7/2007 | Broeke et al. ............... 438/725 |
| 7,261,981 B2 * | | 8/2007 | Lavin et al. ................. 430/5 |
| 7,328,419 B2 * | | 2/2008 | Vuong et al. ................ 716/113 |
| 7,354,681 B2 * | | 4/2008 | Laidig et al. ............... 430/5 |
| 7,506,299 B2 * | | 3/2009 | Socha et al. ................ 716/132 |
| 7,512,928 B2 * | | 3/2009 | Jessen et al. ............... 716/53 |
| 7,774,738 B2 * | | 8/2010 | Moon .......................... 716/55 |
| 2009/0317749 A1 * | | 12/2009 | Lee ............................ 430/319 |
| 2010/0047699 A1 * | | 2/2010 | Broeke et al. ................ 430/5 |
| 2010/0203430 A1 * | | 8/2010 | Ye et al. ...................... 430/5 |

FOREIGN PATENT DOCUMENTS

JP 9-297388 A 11/1997
KR 10-2008-0092548 10/2008

OTHER PUBLICATIONS

Moon et al.; "Lithography process margin enhancement using illumination based assist pattern"; Proc. of SPIE vol. 6283, 62832X; 2006; 9 pages.*

* cited by examiner

*Primary Examiner* — Naum Levin
(74) *Attorney, Agent, or Firm* — Marshall, Gerstein & Borun LLP (57) ABSTRACT

Disclosed is a method of fabricating an assist feature in a photomask, which includes: fabricating a design layout in which main patterns are arranged; setting a critical dimension (a) of assist features to be formed and a spacing (b) between the main pattern and the assist feature; setting a first expanded region extending from the main pattern by (a+b); setting a second expanded region extending from the main pattern by (b); and setting the assist features by removing the second expanded region from the first expanded region.

4 Claims, 10 Drawing Sheets

METHOD FOR FABRICATING ASSIST FEATURES IN A PHOTOMASK

CROSS-REFERENCE TO RELATED APPLICATIONS

The present application claims priority to Korean patent application number 10-2009-0059919, filed on Jul. 1, 2009, which is incorporated by reference in its entirety.

BACKGROUND OF THE INVENTION

The present invention relates to a method of laying out a photomask, and more particularly, to a method of fabricating an assist feature in a photomask.

In recent, as an integration degree of a semiconductor device has been rapidly increased, a pitch of a pattern formed on a wafer has been continuously narrowed. As the result, a limitation in a photography process for fabricating the pattern has become more serious. Accordingly, to form a pattern requiring high resolution, a laser with a short wavelength and a projection lens having a high numerical aperture have been used. However, there occurs a problem that a margin in a depth of focus is lowered as the numerical aperture is increased. Therefore, various methods for solving the problem are used and one of them is a method of inserting an assist feature in a periphery of a main pattern. Particularly, the insertion of the assist feature is mostly necessarily required to form a pattern where an isolated pattern, independently disposed spaced apart from the main pattern at a considerable distance, and a dense pattern, arranged close to other patterns, coexist.

Figure 1:
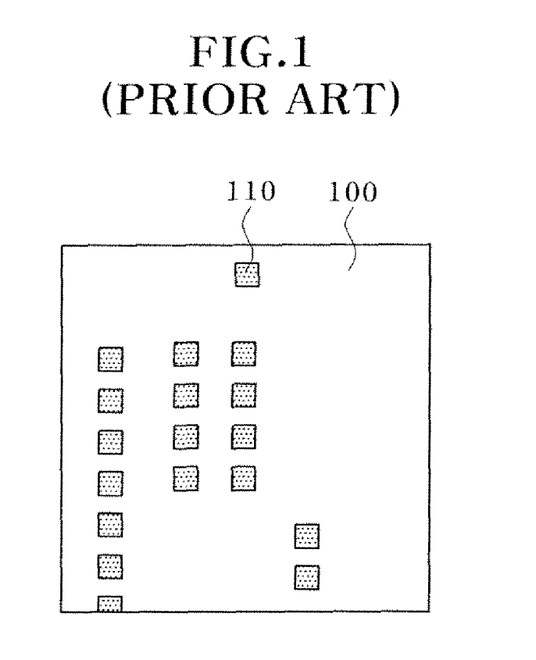
FIGS. 1 and 2 are layouts illustrating a conventional method of fabricating an assist feature in a photomask.
Figure 2:
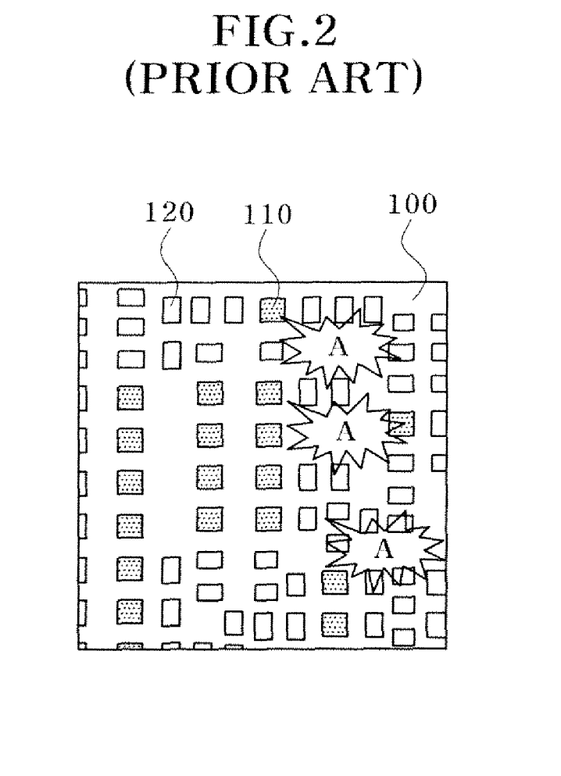
Figure 3:
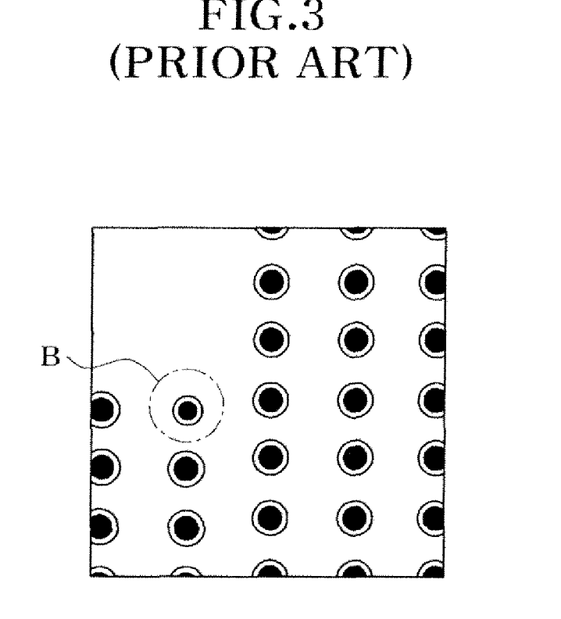
FIGS. 3 and 4 are illustrations showing the pattern formed on a wafer using the photomask having the assist feature fabricated by the conventional method.
Figure 4:
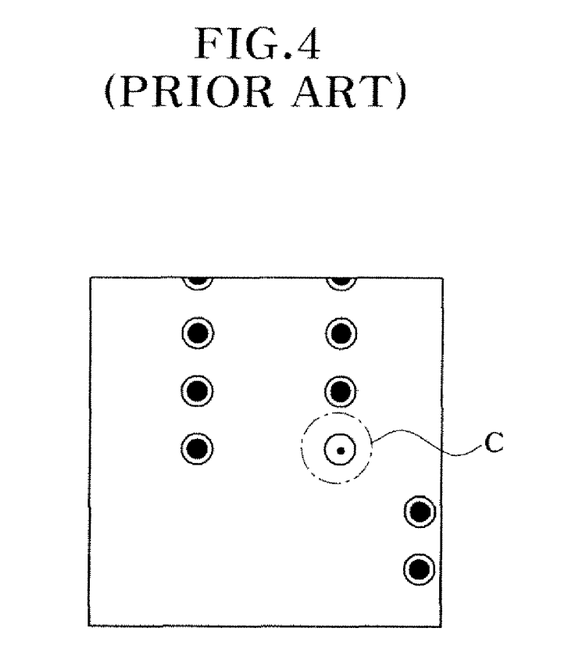

FIGS. 1 and 2 are layouts illustrating a conventional method of fabricating an assist feature in a photomask. Also, FIGS. 3 and 4 are illustrations showing the pattern formed on a wafer using the photomask having the assist feature fabricated by the conventional method. First, as illustrated in FIG. 1, main patterns 110 are placed on a light transmitting substrate 100. The main patterns 110 are, for example, patterns for fabricating a contact hole, and arranged in an irregular arrangement including a dense pattern and an isolated pattern. Next, as illustrated in FIG. 2, assist patterns 120 are placed in a periphery of the main patterns 110 according to a photomask fabrication rule. The photomask fabrication rule can be made by an exposure simulation. Successively, an optical proximity correction is implemented and a practical photomask is then fabricated on the basis of the fabricated layout.

However, in this conventional method, the fabrication rule of situating the assist pattern 120 is influenced by the arrangement of the main patterns 110, and a portion which clashes with the mask fabrication rule is generated or a portion in which the assist feature cannot be inserted by the mask fabrication rule is generated in a region in which adjacent main patterns 110 are arranged irregularly as indicated by "A" in FIG. 2. When implementing an actual exposure using the photomask fabricated as such, a pattern defect can result as indicated by "B" in FIG. 3 and "C" in FIG. 4.

SUMMARY OF THE INVENTION

Embodiments of the present invention are directed to a method of fabricating an assist feature in a photomask, which can arrange the assist feature without clash or violation in a portion where main patterns are arranged irregularly by fabricating the assist feature not based on the mask fabrication rule.

In one embodiment, a method of fabricating an assist feature in a photomask includes: fabricating a design layout in which main patterns are arranged; setting a critical dimension (a) of assist features to be formed and a spacing (b) between the main pattern and the assist feature; setting a first expanded region extending from the main pattern by (a+b); setting a second expanded region extending from the main pattern by (b); and setting the assist features by removing the second expanded region from the first expanded region.

Preferably, the setting of the assist features includes: setting an assist feature region made by removing the second expanded region from the first expanded region; and setting the assist feature with a region of the assist feature region which remains after removing a region violating a rule check. More preferably, the setting of the assist features further includes: removing a region of the assist feature region, which has a possibility of existence of a residue.

Preferably, the main patterns have a mixed layout of dense form and isolated form.

In another embodiment, a method of fabricating an assist feature in a photomask, comprising: fabricating a design layout in which main patterns are arranged; setting a critical dimension (a) of assist features to be formed and a spacing (b) between the main pattern and the assist feature; setting a first directional first expanded region extending from the main pattern in a first direction by (a+b); setting a first directional second expanded region extending from the main pattern in the first direction by (b); setting a first directional assist feature by removing the first directional second expanded region from the first directional first expanded region; setting a second directional first expanded region extending from the main pattern by (a+b) in a second direction perpendicular to the first direction; setting a second directional second expanded region extending from the main pattern along the second direction by (b); setting a second directional assist feature by removing the second directional second expanded region from the second directional first expanded region; and fabricating an assist feature corresponding to the first directional assist feature region and the second directional assist feature region.

Preferably, the setting of the assist feature includes: setting the assist feature with a region of the first directional assist feature region and the second directional assist feature region which remains after removing a region violating a rule check. More preferably, the setting of the assist feature includes: removing a region of the first directional assist feature region and the second directional assist feature region, which has a possibility of existence of a residue.

Preferably, the main patterns have a mixed layout of dense form and isolated form.

In accordance with the present invention, since the design layout is fabricated and the assist feature is then fabricated based on the fabricated design layout, the assist feature is not influenced by the mask fabrication rule. Further, since the rule check is implemented in the subsequent step, it is possible to fabricate the assist feature alone, which meets the mask fabrication rule.

DESCRIPTION OF SPECIFIC EMBODIMENTS

Hereinafter, preferred embodiments of the present invention will be described in detail with reference to the accompanying drawings.

Figure 5:
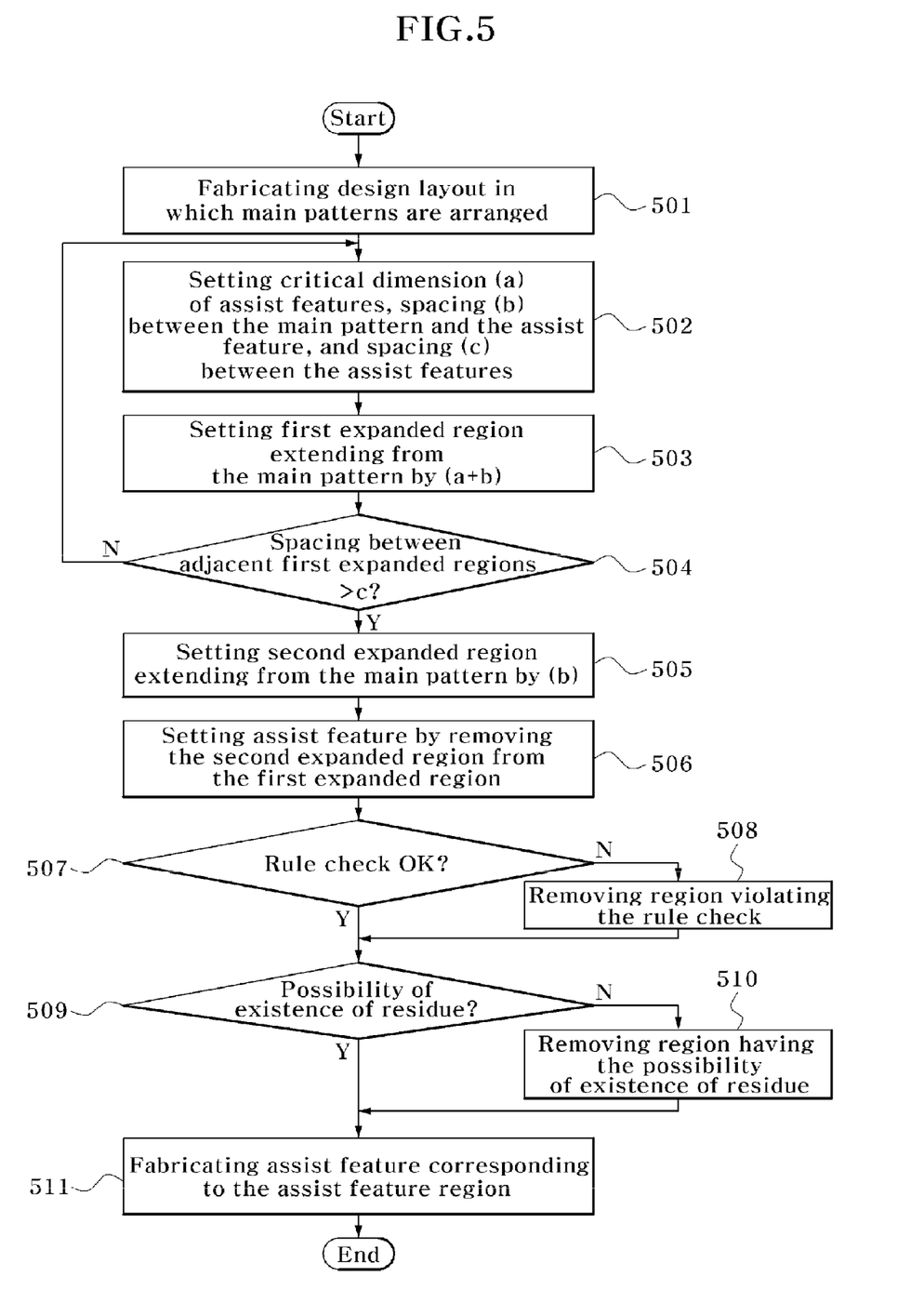
FIG. 5 is a flowchart of a method of fabricating an assist feature in a photomask in accordance with an embodiment of the present invention.
Figure 6A:
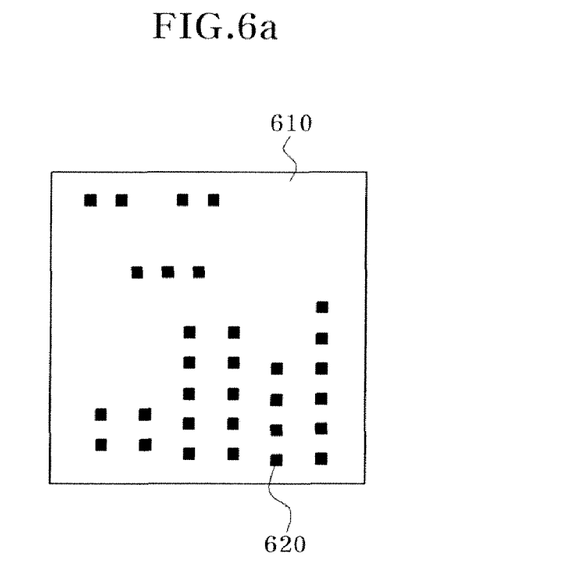
FIGS. 6a through 6e are layouts illustrating the steps of FIG. 5.

FIG. 5 is a flowchart of a method of fabricating an assist feature in a photomask in accordance with an embodiment of the present invention. And, FIGS. 6a through 6c are layouts illustrating the steps of FIG. 5.

Referring to FIG. 5, a design layout in which the main patterns are arranged is fabricated first (step 501). An example of this design layout is illustrated in FIG. 6a. As illustrated in FIG. 6a, a plurality of main patterns 620 are arranged on a substrate region 610 which corresponds to a light transmitting substrate. In this example, the main patterns 620 are patterns for fabricating a contact hole, and include all of the main patterns 620 arranged densely close to one another in a predetermined region and the main patterns 620 arranged independently from other main patterns 620 with a relatively distant spacing.

Next, a critical dimension (a) of assist features to be fabricated, a spacing (b) between the main pattern 620 and the assist feature and a spacing (c) between the adjacent assist features are set (step 502). These critical dimensions (a) of the assist feature, spacing (b) between the main pattern 620 and the assist feature and spacing (c) between the adjacent assist features can be set in consideration of a layout configuration, a profile, a use of the main patterns 620 and so on.

Figure 6B:
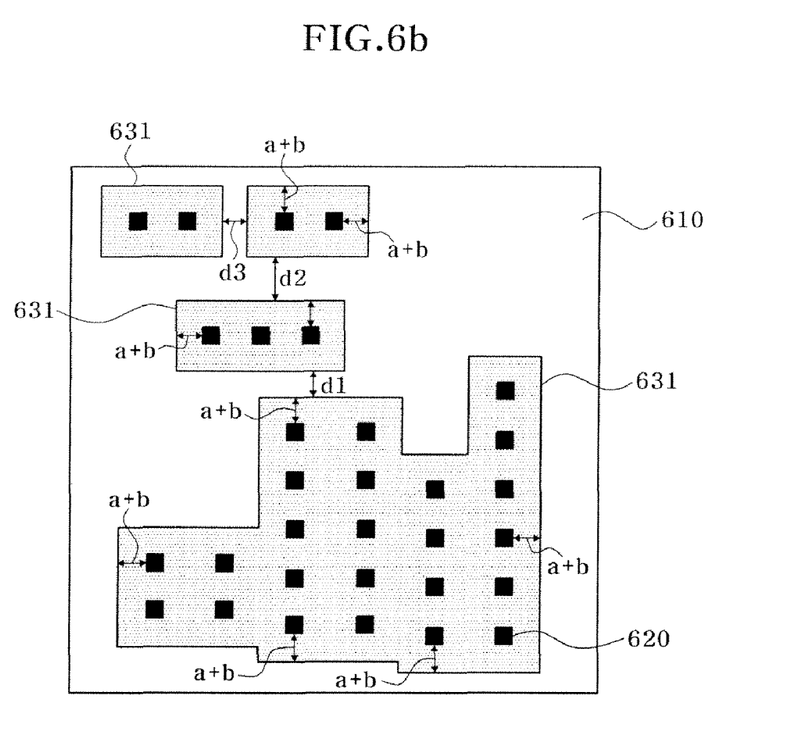
Figure 6C:
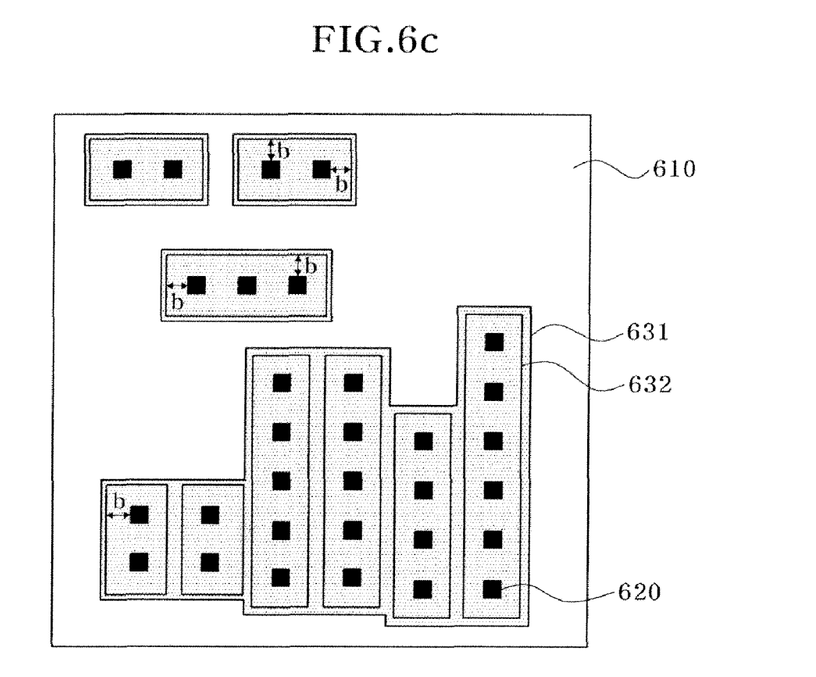

Next, as illustrated in FIG. 6b, a first expanded region 631 is set, which extends from the main patterns 620 by a value of a sum of the critical dimension (a) of the assist feature and the spacing (b) between the main pattern 620 and the assist feature. Accordingly, the first expanded region 631 includes all of the main patterns 620, and a spacing between the main pattern 620 and an edge of the first expanded region 631 becomes (a+b).

Next, whether spacings d1, d2, d3 between adjacent first expanded regions 631 are greater than the set spacing (c) between the assist features is examined (step 504). The fact that the spacings d1, d2, d3 between adjacent first expanded regions 631 are greater than the set spacing (c) between the assist features means that the main pattern 620 in the first expanded region 631 and the main pattern 620 adjacent another first expanded region 631 are arranged very close to each other, and in this case, there can be no need to dispose the assist feature or there can be a need to correct a size setting related to the assist feature. Accordingly, in this case, the procedure is returned to the step 502 and the critical dimension (a) of the assist features to be fabricated, the spacing (b) between the main pattern 620 and the assist feature and the spacing (c) between the adjacent assist features are reset. However, if this step is unnecessary, the step 504 can be omitted.

Next, as illustrated in FIG. 6c, a second expanded region 632 is set, which extends from the main patterns 620 by the spacing (b) between the main pattern 620 and the assist feature. This second expanded region 632 includes all of the main patterns 620 and is included in the first expanded region 631. Also, a spacing between the second expanded region 632 and the first expanded region 631 is equal to the critical dimension (a) of the assist feature.

Figure 6D:
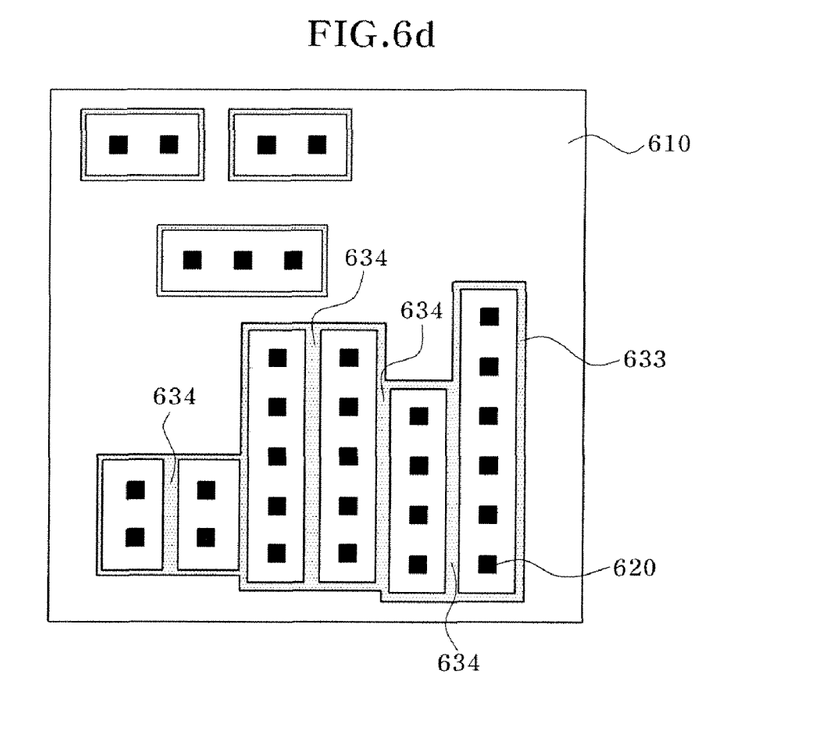

Next, as illustrated in FIG. 6d, assist feature regions 633, 634 are set by removing the second expanded region 632 from the first expanded region 631 (step 506). Next, whether the assist features 633, 634 meet a rule check is examined by implementing the rule check using a model or function (step 507). When there is an assist feature region 634 not meeting the rule check in the examination, the assist feature region 634 is removed to remain an assist feature region 634 meeting the rule check alone (step 508). Next, whether there is a possibility of existence of a residue is examined (step 509). When there is an assist feature region 634 having the possibility of existence of a residue in the examination, the assist feature region 634 is removed to remain an assist feature region 633 having no possibility of existence of a residue alone (step 510).

Figure 6E:
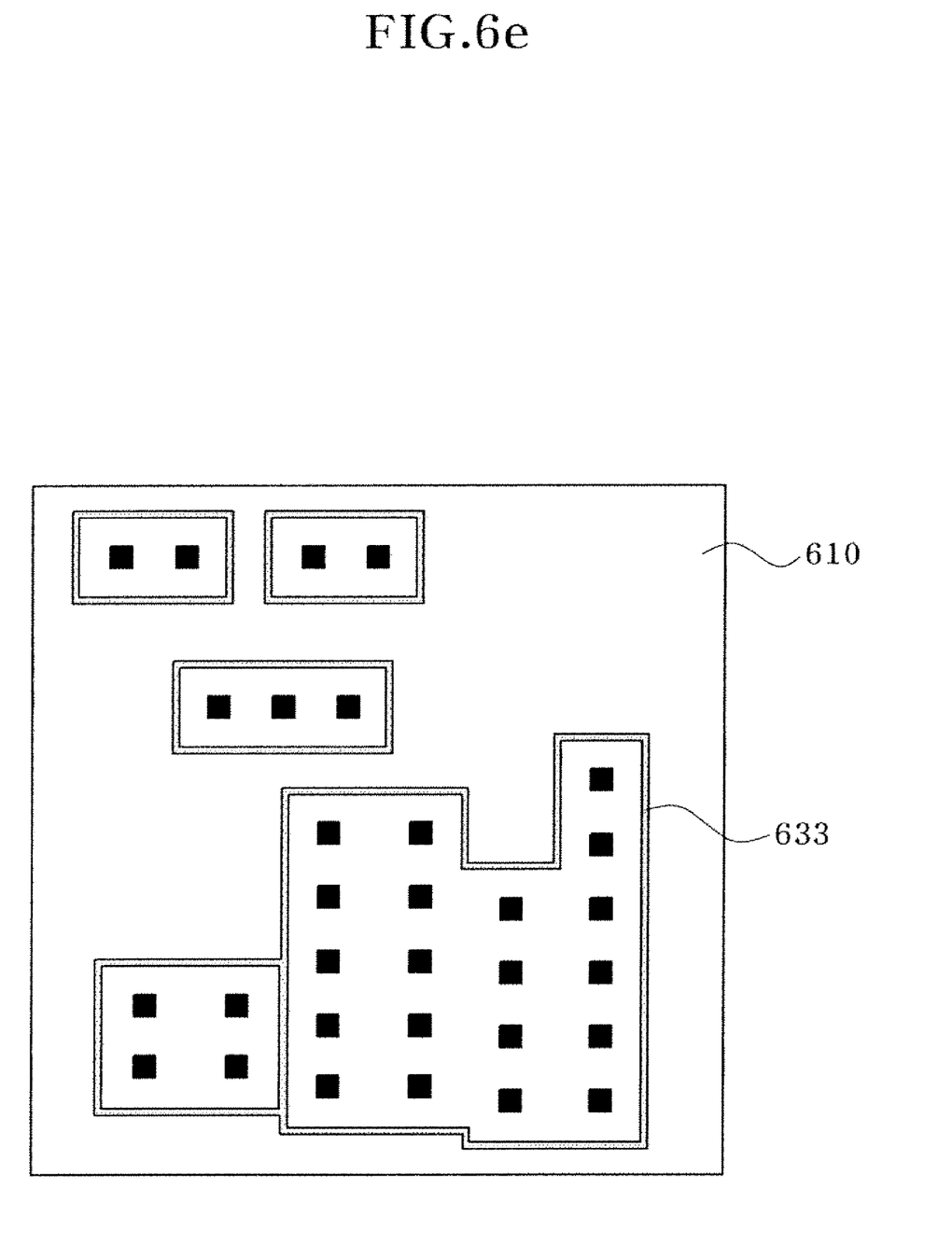

Next, as illustrated in FIG. 6e, the assist feature region 633 of the assist feature regions 633, 634 in FIG. 6d, except for the assist feature region 634 in FIG. 6d not meeting the rule check and the assist feature region 634 in FIG. 6d having the possibility of existence of a residue is set to assist features (step 511). After that, subsequent bias setting or optical proximity correction is implemented in consideration of the set assist pattern. If necessary, after fabricating the assist feature 633, the steps 501 to 511 can be repeatedly implemented to form another assist feature of other positions and other sizes. As described above, in the method of fabricating an assist feature in accordance with an embodiment of the present invention, since the design layout is fabricated and the assist feature is then fabricated based on the fabricated design layout, the assist feature is not influenced by the mask fabrication rule. Further, since the rule check is implemented in the subsequent step, it is possible to fabricate the assist feature alone, which meets the mask fabrication rule.

Figure 7:
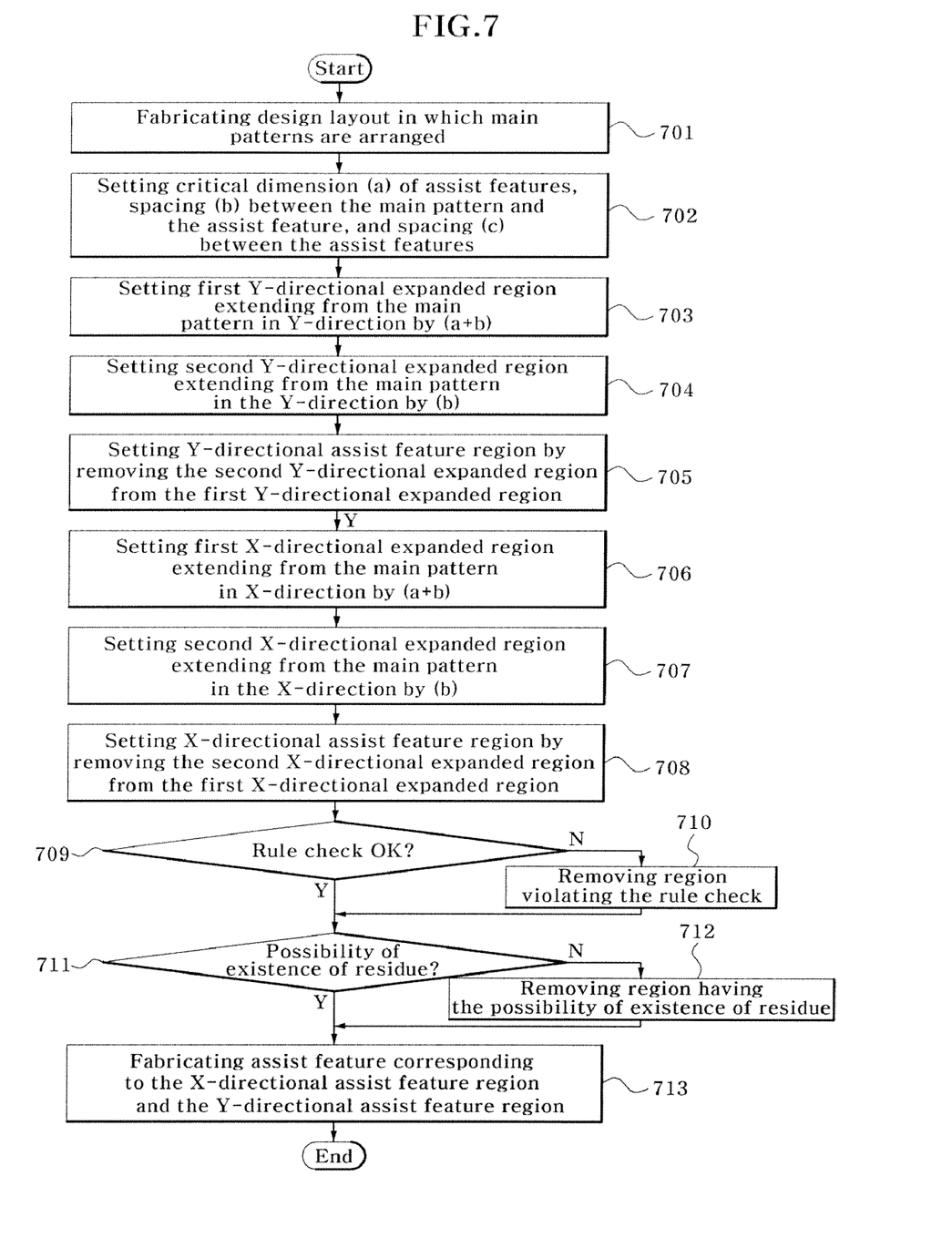
FIG. 7 is a flowchart of a method of fabricating an assist feature in a photomask in accordance with another embodiment of the present invention.

FIG. 7 is a flowchart of a method of fabricating an assist feature in a photomask in accordance with another embodiment of the present invention. And, FIGS. 8a through 8c are layouts illustrating the steps of FIG. 7.

Referring to FIG. 7, a design layout in which the main patterns are arranged is fabricated first as illustrated in FIG. 6a (step 701). Next, a critical dimension (a) of assist features to be fabricated, a spacing (b) between the main pattern 620 and the assist feature and a spacing (c) between the adjacent assist features are set (step 702). These critical dimensions (a) of the assist feature, spacing (b) between the main pattern and the assist feature and spacing (c) between the adjacent assist features can be set in consideration of a layout configuration, a profile, a use of the main patterns and so on.

Figure 8A:
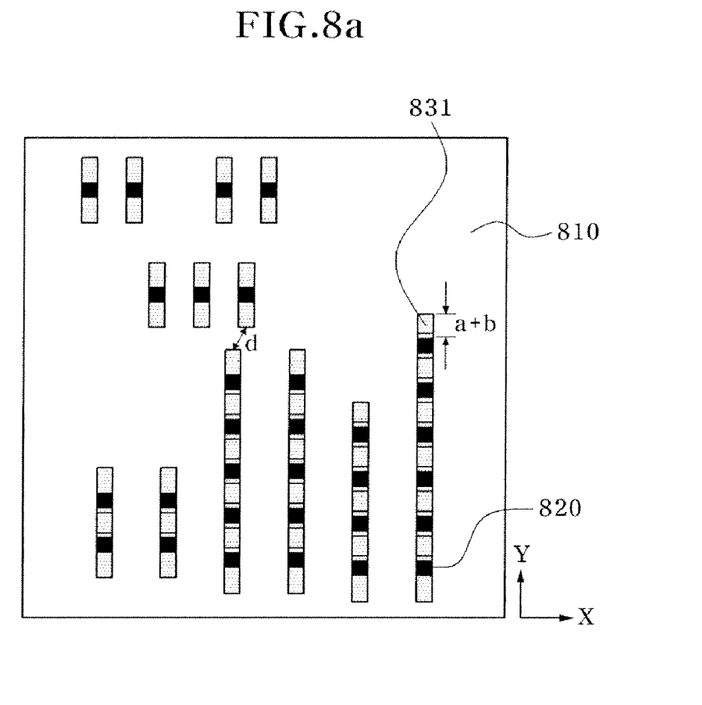
FIGS. 8a through 8e are layouts illustrating the steps of FIG. 7.
Figure 8B:
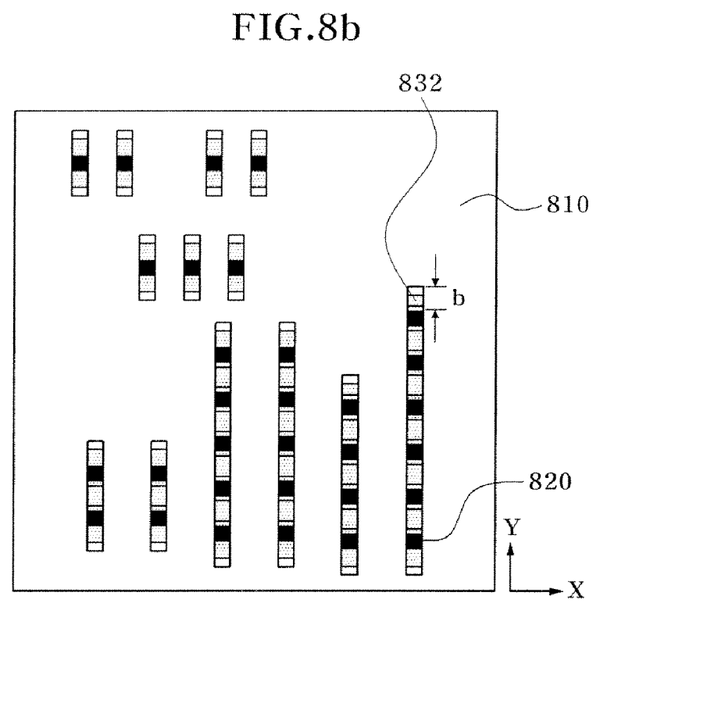
Figure 8C:
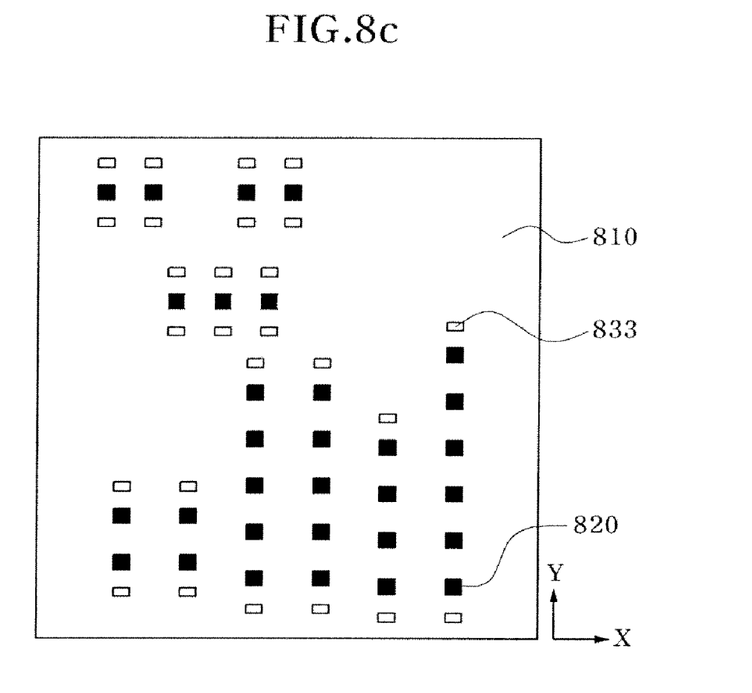

Next, as illustrated in FIG. 8a, a first Y-directional expanded region 831 is set, which extends in a Y-direction from the main patterns 820 by a value of a sum of the critical dimension (a) of the assist feature and the spacing (b) between the main pattern 820 and the assist feature (step 703). Next, as illustrated in FIG. 8b, a second Y-directional expanded region 832 is set, which extends along the Y-direction from the main patterns 820 by the spacing (b) between the main pattern 820 and the assist feature. (step 704). Next, as illustrated in FIG. 8c, a Y-directional assist feature region 833 is set by removing the second Y-directional expanded region (832 of FIG. 8b) from the first Y-directional expanded region (831 of FIG. 8b) (step 705).

Figure 8D:
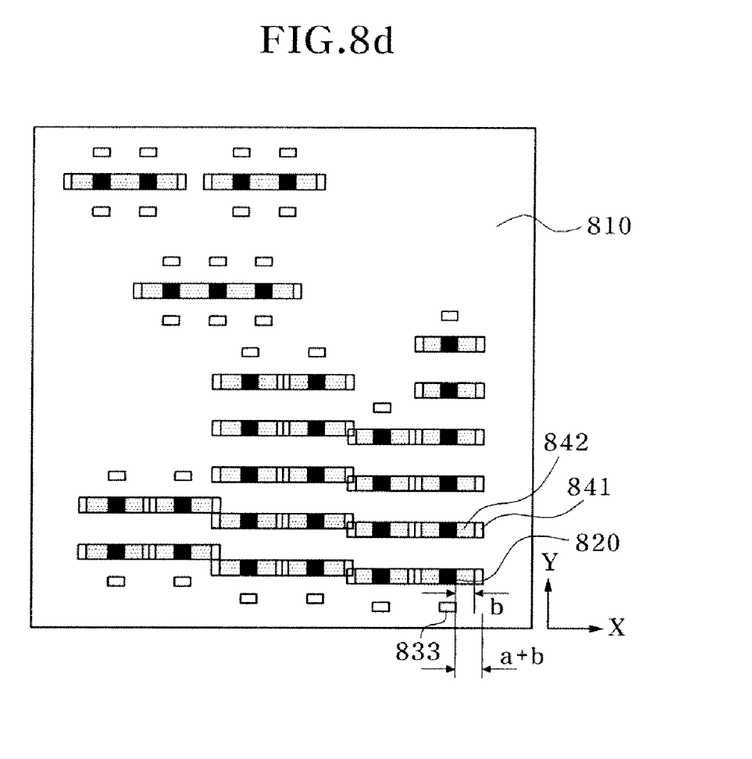
Figure 8E:
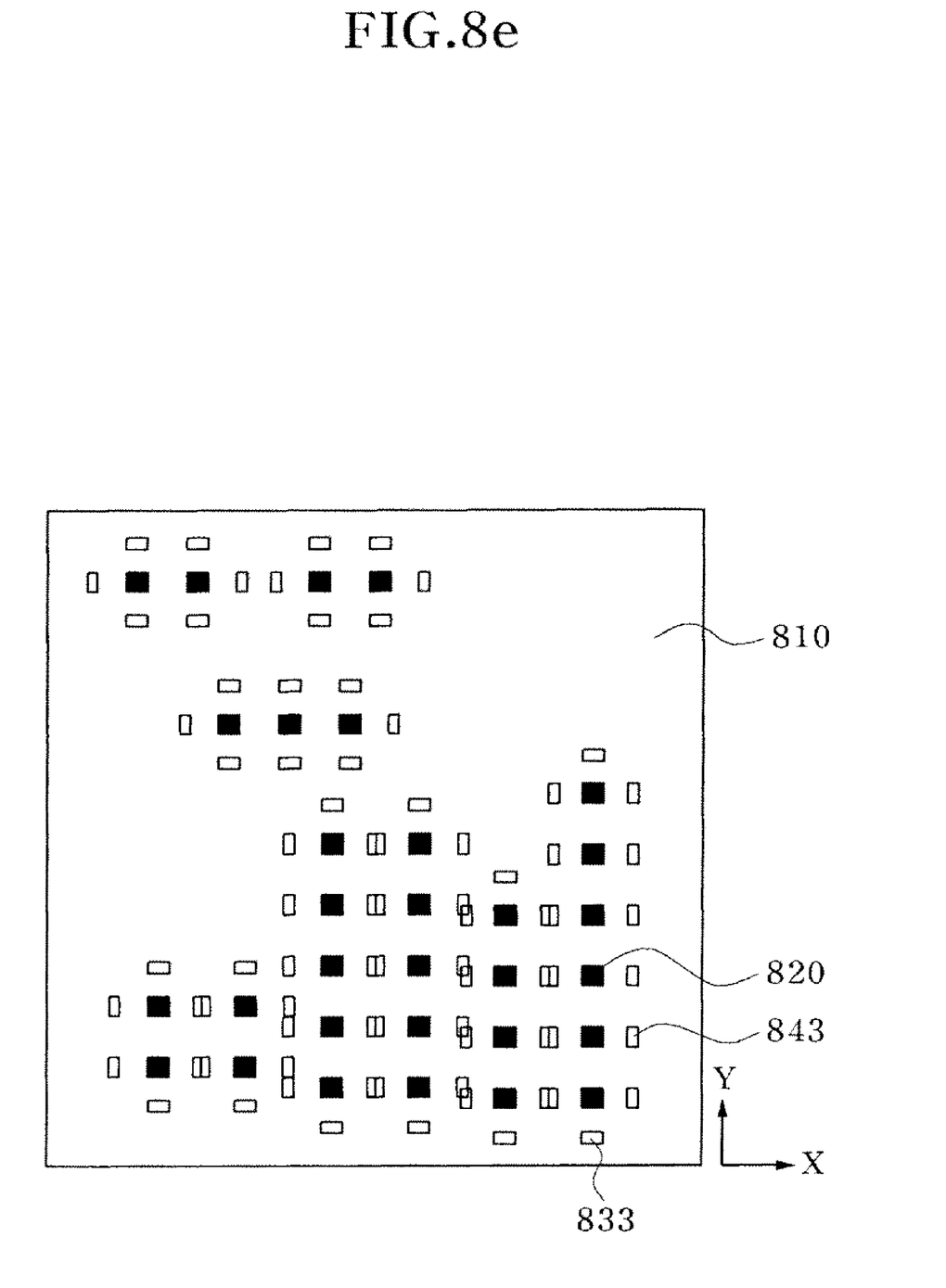

Next, as illustrated in FIG. 8d, a first X-directional expanded region 841 is set, which extends in an X-direction from the main patterns 820 by a value of a sum (a+b) of the critical dimension (a) of the assist feature and the spacing (b) between the main pattern 820 and the assist feature (step 706). Next, a second X-directional expanded region 842 is set, which extends along the X-direction from the main patterns 820 by the spacing (b) between the main pattern 820 and the assist feature (step 707). Next, as illustrated in FIG. 8*e*, an X-directional assist feature region 843 is set by removing the second X-directional expanded region (842 of FIG. 8*d*) from the first X-directional expanded region (841 of FIG. 8*d*) (step 708).

Next, whether the Y-directional assist feature region 833 and the X-directional assist feature region 843 meet a rule check is examined by implementing the rule check using a model or function (step 709). When there is an assist feature region not meeting the rule check in the examination, the assist feature region is removed (step 710). Next, whether there is a possibility of existence of a residue is examined (step 711). When there is an assist feature region having the possibility of existence of a residue in the examination, the assist feature region is removed (step 712). Next, the Y-directional assist feature region 833 and X-directional assist feature region 843, except for the Y-directional assist feature region 833 and X-directional assist feature region 843 not meeting the rule check or having the possibility of existence of a residue are set to assist features (step 713). After that, subsequent bias setting or optical proximity correction is implemented in consideration of the set assist pattern. If necessary, after fabricating the Y-directional assist feature region 833 and the X-directional assist feature region 843, the steps 701 to 713 can be repeatedly implemented to form another Y-directional assist feature and X-directional assist feature of other positions and other sizes.

While the present invention has been described with respect to the specific embodiments, it will be apparent to those skilled in the art that various changes and modifications may be made without departing from the spirit and scope of the invention as defined in the following claims.

What is claimed is:

1. A method of fabricating an assist feature in a photomask, comprising:
    disposing main patterns on substrate, wherein the main patterns are contact hole patterns;
    determining a critical dimension (a) of assist features to be formed and a spacing (b) between the main pattern and the assist feature;
    setting a first expanded region extending from the main pattern by (a+b), wherein the first expanded region includes the main patterns;
    setting a second expanded region extending from the main pattern by (b), wherein the second expanded region includes the main patterns in the first expanded region; and
    forming the assist features on the substrate, wherein the assist features are disposed in the region remained by removing the second expanded region from the first expanded region.

2. The method of claim 1, wherein the forming of the assist features includes:
    setting a first assist feature region made by removing the second expanded region from the first expanded region;
    setting a second assist feature region made by removing a region violating a rule check from the first assist feature region; and
    forming the assist features in the second assist feature region on the substrate.

3. The method of claim 2, wherein the forming of the assist features further includes: removing a region, which has a possibility of existence of a residue, from the first assist feature region.

4. The method of claim 1, wherein the main patterns have a mixed layout of dense form and isolated form.

* * * * *